United States Patent
Wang et al.

(10) Patent No.: US 10,804,083 B2
(45) Date of Patent: Oct. 13, 2020

(54) CATHODE ASSEMBLY, PHYSICAL VAPOR DEPOSITION SYSTEM, AND METHOD FOR PHYSICAL VAPOR DEPOSITION

(71) Applicant: TAIWAN SEMICONDUCTOR MANUFACTURING CO., LTD., Hsinchu (TW)

(72) Inventors: Yi-Chieh Wang, Taipei (TW); Cheng-Kuo Wang, Zhubei (TW); Chung-Han Lin, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 455 days.

(21) Appl. No.: 14/327,462

(22) Filed: Jul. 9, 2014

(65) Prior Publication Data
US 2016/0013032 A1    Jan. 14, 2016

(51) Int. Cl.
  *C23C 14/34* (2006.01)
  *H01J 37/34* (2006.01)
  *C23C 14/54* (2006.01)
  *C23C 14/52* (2006.01)

(52) U.S. Cl.
  CPC ........ *H01J 37/347* (2013.01); *C23C 14/3407* (2013.01); *C23C 14/52* (2013.01); *C23C 14/54* (2013.01); *C23C 14/543* (2013.01); *H01J 37/3435* (2013.01); *H01J 37/3479* (2013.01); *H01J 37/3497* (2013.01)

(58) Field of Classification Search
  CPC .... C23C 14/543; C23C 14/52; H01J 37/2405; H01J 37/3479
  See application file for complete search history.

(56) References Cited

U.S. PATENT DOCUMENTS

| 4,407,708 | A | * | 10/1983 | Landau | ............... | H01J 37/3405 |
| | | | | | | 204/192.13 |
| 2005/0133365 | A1 | * | 6/2005 | Hong | ................. | C23C 14/3407 |
| | | | | | | 204/298.2 |
| 2005/0186974 | A1 | | 7/2005 | Cetinkaya et al. | | |
| 2006/0081459 | A1 | * | 4/2006 | Tsai | ....................... | C23C 14/35 |
| | | | | | | 204/192.13 |
| 2007/0017800 | A1 | * | 1/2007 | Cetinkaya | ............... | C23C 14/34 |
| | | | | | | 204/192.1 |
| 2009/0026073 | A1 | * | 1/2009 | Harada | .................. | C23C 14/35 |
| | | | | | | 204/298.16 |

(Continued)

FOREIGN PATENT DOCUMENTS

| CN | 101268332 A | 9/2008 |
| CN | 101641458 A | 2/2010 |

(Continued)

*Primary Examiner* — Jason Berman
(74) *Attorney, Agent, or Firm* — Maschoff Brennan

(57) ABSTRACT

A cathode assembly for a physical vapor deposition (PVD) system includes a target holder and a thickness detector. The target holder is for holding a target, in which the target has a first major surface and a second major surface. The first major surface and the second major surface are respectively proximal and distal to the target holder. The thickness detector is disposed on the target holder. At least one portion of the first major surface is exposed to the thickness detector for allowing the thickness detector to detect the thickness of the target through the first major surface.

20 Claims, 2 Drawing Sheets

(56) References Cited

U.S. PATENT DOCUMENTS

2010/0126852 A1* 5/2010 Ohmi ...................... C23C 14/35
                                                            204/298.03

FOREIGN PATENT DOCUMENTS

| CN | 102534523 S | 7/2012 |
|---|---|---|
| JP | 63290270 A * | 11/1988 |
| JP | H02-282475 A | 11/1990 |
| JP | H11-061403 A | 3/1999 |
| JP | 2010-237065 A | 10/2010 |
| KR | 10-2007-0062810 A | 6/2007 |
| TW | 200716777 A | 5/2007 |
| TW | 201030811 A1 | 8/2010 |

* cited by examiner

CATHODE ASSEMBLY, PHYSICAL VAPOR DEPOSITION SYSTEM, AND METHOD FOR PHYSICAL VAPOR DEPOSITION

BACKGROUND

The present disclosure relates to physical vapor deposition (PVD) systems. More particularly, the present disclosure relates to cathode assemblies for PVD systems.

PVD describes a variety of vacuum deposition methods used to deposit thin films by the condensation of a vaporized form of the desired film material onto surfaces of various workpieces. PVD is fundamentally a vaporization coating technique, involving the transfer of material on an atomic level. The method of PVD mainly involves physical processes such as high-temperature vacuum evaporation with subsequent condensation, or plasma sputter bombardment.

The plasma sputter bombardment is a process whereby atoms are ejected from a target due to bombardment of the target by energetic particles. The atoms ejected from the target tend to deposit on all surfaces in the vacuum chamber. Therefore, a substrate (such as a wafer) placed in the chamber will be coated with a thin film.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
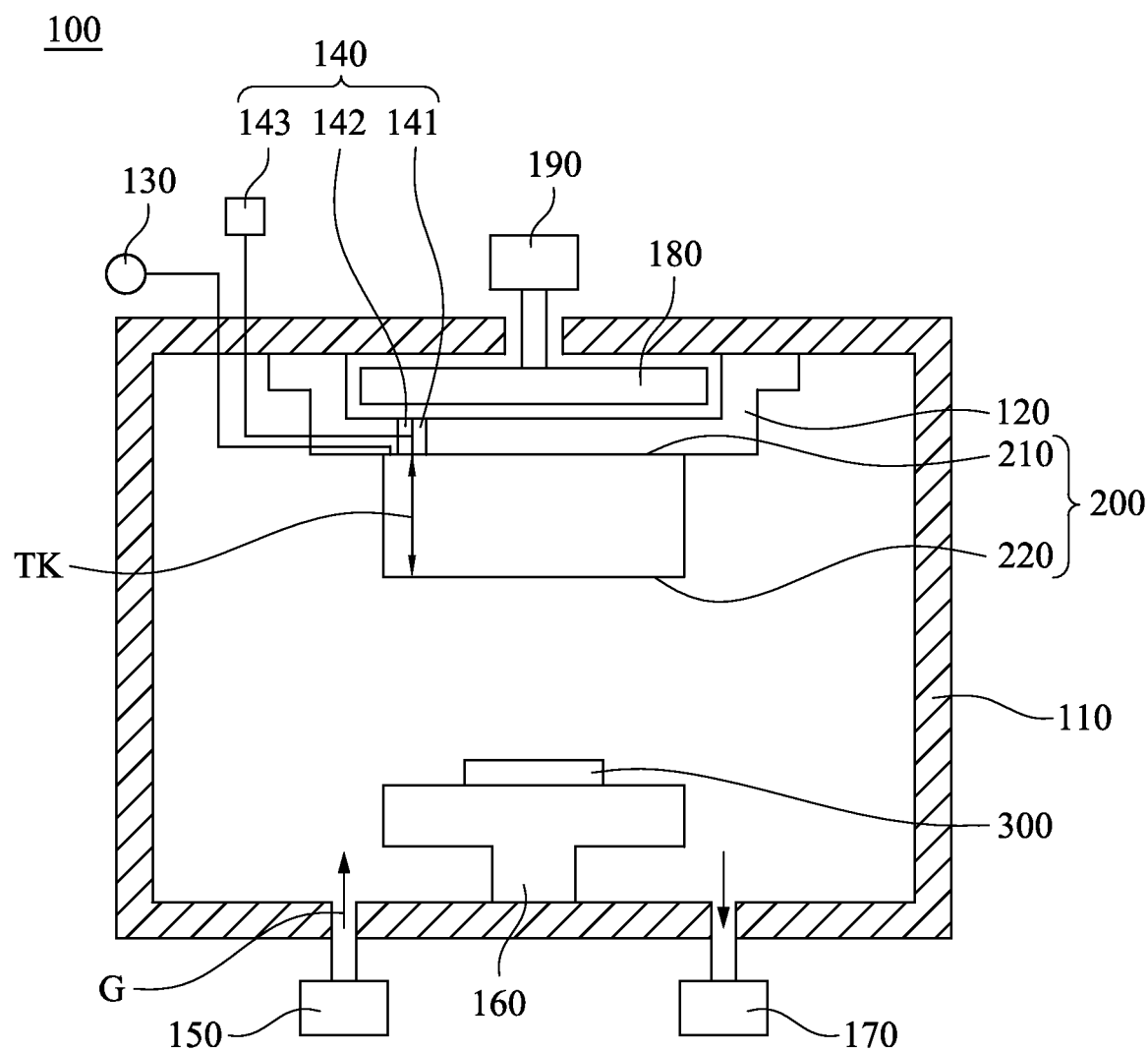
FIG. 1 is a schematic diagram of a physical vapor deposition system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of a physical vapor deposition (PVD) system 100 in accordance with some embodiments of the present disclosure. As shown in FIG. 1, the PVD system 100 includes a processing chamber 110, a target holder 120, a power supply 130, a thickness detector 140, a gas system 150, and a supporting member 160. The target holder 120 is disposed in the processing chamber 110 for holding a target 200. The power supply 130 is in electrical communication with the target 200 for applying a voltage to the target 200. The thickness detector 140 is disposed in the processing chamber 110 for detecting a thickness TK of the target 200. The gas system 150 is configured for introducing carrier gas G into the processing chamber 110. The supporting member 160 is disposed in the processing chamber 110 for holding a substrate 300.

Since the sputtering of the target 200 is easily influenced by impurities, particularly oxidizing agents such as oxygen and water moisture, the processing chamber 110 is evacuated to a pressure lower than the atmospheric pressure by a vacuum system 170 before the sputtering of the target 200 starts. In this way, the content of the impurities like oxygen and water moisture can be removed. In some embodiments, the vacuum system 170 creates the vacuum environment by pumping away gas inside the processing chamber 110. However, this approach to employ the vacuum system 170 to create the vacuum environment does not limit the present disclosure.

The gas system 150 introduces the carrier gas G into the processing chamber 110. Technically speaking, the carrier gas G in the processing chamber 110 is a kind of plasma, which is in fact a partially ionized gas. The composition of the partially ionized gas includes various kinds of electrons, ions, uncharged molecules, and radicals. The carrier gas G is, for example, argon. Nevertheless, the carrier gas G is not limited to argon. In case the PVD system 100 is operated for forming titanium nitride on the substrate 300, the carrier gas G can be, for example, nitrogen.

When the voltage is applied to the target 200 by the power supply 130, the target 200 is electrically charged and becomes a cathode in the processing chamber 110. The negatively charged cathode attracts the positively charged ions in the plasma to accelerate and bombard the target 200. Due to the bombardment of the target 200 by the positively charged ions, atoms are ejected from the target 200. The ejected atoms are deposited over the surface of the substrate 300 held by the supporting member 160. During the bombardment of the target 200 by the ions, the target 200 is depleted. After the target 200 is depleted to some degree, the target 200 should be replaced with a new target 200.

In some embodiments, the target 200 is made of a metallic material, such as aluminum-copper alloy or titanium.

The thickness detector 140 is disposed in the processing chamber 110. In some embodiments, the thickness detector 140 is disposed on the target holder 120. Furthermore, the target 200 has a first major surface 210 and a second major surface 220 which are respectively proximal and distal to the target holder 120, and at least one portion of the first major surface 210 is exposed to the thickness detector 140 for allowing the thickness detector 140 to detect the thickness TK of the target 200 through the first major surface 210.

In some embodiments, the thickness detector 140 includes a wave generator 141, a wave receiver 142, and a computing unit 143. The wave generator 141 is configured for applying a wave to the target 200 through the first major surface 210.

The wave penetrates through the first major surface 210 and then travels through the target 200 to the second major surface 220. Afterwards, the wave gets reflected at an interface between the target 200 and the vacuum environment inside the processing chamber 110, i.e., the second major surface 220. The wave receiver 142 is configured for receiving the reflected wave. The computing unit 143 is configured for determining the thickness TK of the target 200 according to the received wave. Given the velocity of the wave in the target 200, by recording a time difference between the applying of the wave by the wave generator 141 and the receiving of the reflected wave by the wave receiver 142, the thickness TK of the target 200 can be determined by the following equation:

$$TK=(V \times T)/2 \qquad (1)$$

where TK is the thickness TK of the target 200, V is the velocity of the wave in the target 200, and T is the time difference between the applying of the wave by the wave generator 141 and the receiving of the reflected wave by the wave receiver 142.

In some embodiments, the wave applied by the wave generator 141 is, for example, an ultrasonic wave. Since a media is needed for the transmission of the ultrasonic wave, when the ultrasonic wave reaches the interface between the target 200 and the vacuum environment inside the processing chamber 110, the ultrasonic wave cannot travel through the vacuum environment, and thus the ultrasonic wave gets reflected at the interface. Nevertheless, the wave applied by the wave generator 141 is not limited to the ultrasonic wave. In some embodiments, the wave applied by the wave generator 141 can be an electromagnetic wave, such as X-radiation.

In this way, the thickness TK of the target 200 can be monitored in situ. During the operation of the PVD system 100, the sputtering of the target 200 occurs and thus the thickness TK of the target 200 gradually decreases. Once the thickness TK of the target 200 is monitored to be less than a predetermined thickness, the operator will terminate the operation and replace the target 200 with a new target 200. Therefore, the target 200 can be adequately utilized in a controllable manner. Consequently, the wastage of the target 200 well before the target 200 is adequately utilized can be alleviated. Furthermore, since the target 200 is adequately utilized, the overall cost and the manpower for the replacement of the target 200 in the long-term is reduced. Moreover, the overall idling time for the PVD system 100 for the replacement of the target 200 can also be reduced. In addition, since the thickness TK of the target 200 is monitored in situ, the chance that the thickness TK of the target 200 becomes too thin such that the PVD system 100 gets damaged is avoided.

In order to achieve an even bombardment of the target 200 by the positively charged ions, the PVD system 100 further includes a magnet 180 and a rotating mechanism 190. The target holder 120 is disposed between the magnet 180 and the target 200, in which the magnet 180 has a north pole and a south pole. The rotating mechanism 190 is configured for rotating the magnet 180, such that the north pole and the south pole of the magnet 180 can rotate and alternatively change position with each other. Under the action of the alternating magnetic field, the bombardment of the target 200 by the ions can be carried out more evenly.

The strength of the magnetic field of the magnet 180 is not uniform along the magnet 180. The magnetic field is stronger around the north pole and the south pole of the magnet 180. Consequently, due to the stronger magnetic field, the bombardment is more vigorous at the corresponding location on the target 200 where the stronger magnetic field has an effect. Hence, the target 200 gets depleted the most at the corresponding location on the target 200 where the strongest magnetic field has an effect. In other words, the thickness TK of the target 200 reduces the most at the corresponding location on the target 200 where the strongest magnetic field has the effect. Therefore, in some embodiments, a vertical projection of the thickness detector 140 on the magnet 180 overlaps with one of the north and south poles, so as to increase the significance of the measurement of the thickness TK of the target 200 by the thickness detector 140. Moreover, this arrangement also acts as an additional protective measure for the PVD system 100. However, it is noted that the position of the thickness detector 140 on the target holder 120 mentioned above does not limit the present disclosure.

Figure 2:
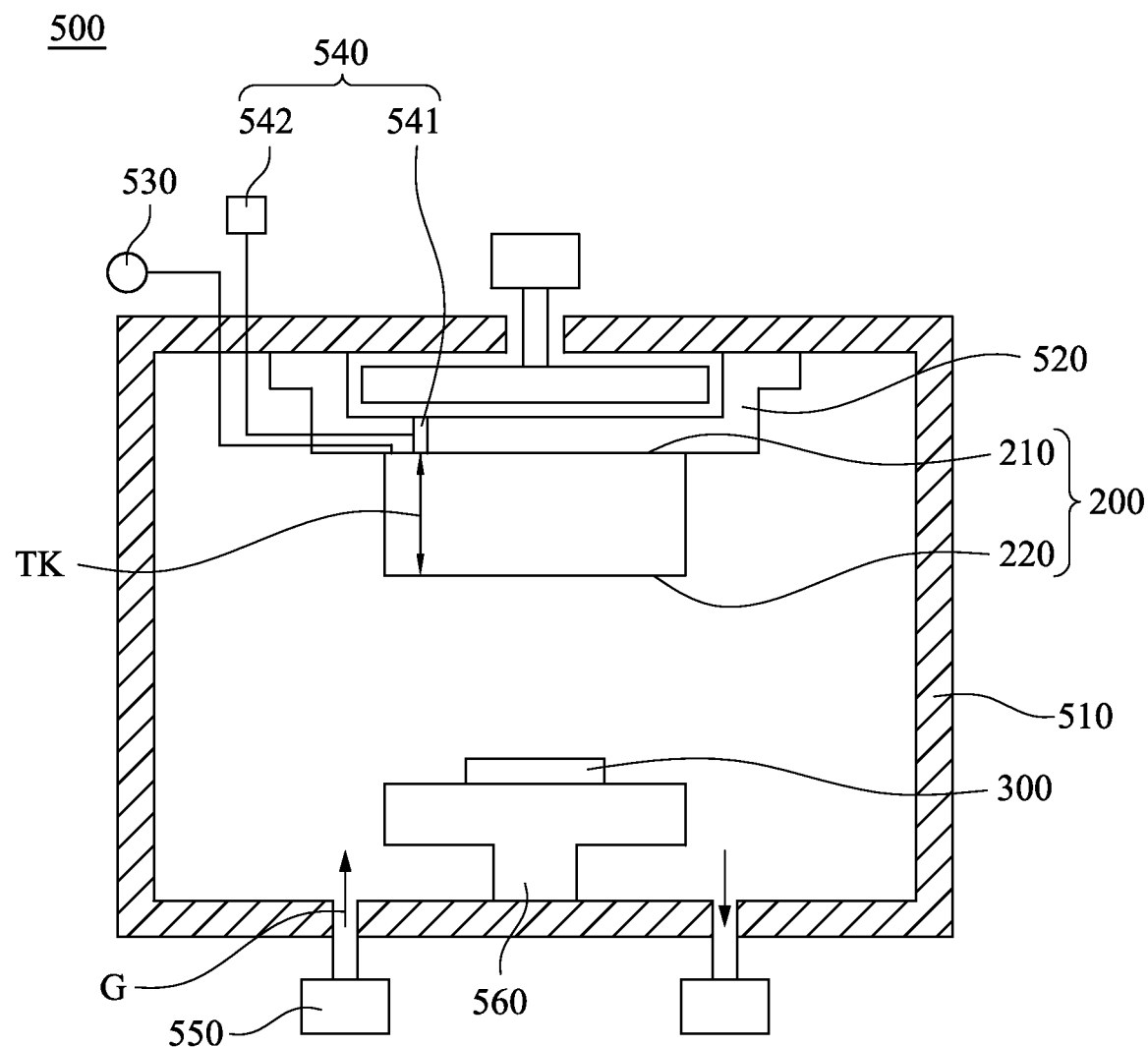
FIG. 2 is a schematic diagram of a physical vapor deposition system in accordance with other embodiments of the present disclosure.

FIG. 2 is a schematic diagram of a PVD system 500 in accordance with other embodiments of the present disclosure. In some embodiments, as shown in FIG. 2, the PVD system 500 includes the thickness detector 540. The thickness detector 540 includes a thermometer 541 and a computing unit 542. The thermometer 541 is configured for measuring the temperature of the target 200. As the target 200 is bombarded by the ions, the second major surface 220 of the target 200 being bombarded becomes hot and the temperature of the second major surface 220 gets higher. The heat is distributed, and a temperature distribution is developed throughout the target 200. That means, an increase of the temperature at the second major surface 220 leads to a corresponding temperature increase at the first major surface 210. As the target 200 gets thinner, the same temperature increase at the second major surface 220 leads to a higher temperature increase at the first major surface 210. Therefore, by measuring the temperature of the target 200 at the first major surface 210, the thickness TK of the target 200 can be deduced. The computing unit 542 is configured for determining the thickness TK of the target 200 according to the measured temperature of the target 200.

In some embodiments, the thermometer 541 is, for example, an infrared thermometer. By measuring the intensity of infrared the target 200 is emitting through the first major surface 210, the temperature of the target 200 at the first major surface 210 and thus the thickness TK of the target 200 can also be deduced. However, this choice of thermometer 541 as an infrared thermometer does not limit the present disclosure.

Since other relevant structural and operating details are all the same as the previous embodiments, they will not be described repeatedly here.

In order to adequately utilizing the target 200, the thickness TK of the target 200 is monitored during the sputtering of the target 200. Once the thickness TK of the target 200 is monitored to be less than a predetermined thickness, the operator will replace the target 200 with a new target 200. Therefore, the target 200 can be adequately utilized in a controllable manner. Consequently, the wastage of the target 200 well before the target 200 is adequately utilized can be alleviated.

In some embodiments of the present disclosure, a cathode assembly for a physical vapor deposition (PVD) system 100/500 includes a target holder 120/520 and a thickness detector 140/540. The target holder 120/520 is for holding a target 200, in which the target 200 has a first major surface 210 and a second major surface 220. The first major surface 210 and the second major surface 220 are respectively proximal and distal to the target holder 120/520. The thickness detector 140/540 is disposed on the target holder 120/520. At least one portion of the first major surface 210 is exposed to the thickness detector 140/540 for allowing the thickness detector 140/540 to detect the thickness TK of the target 200 through the first major surface 210.

In some embodiments of the present disclosure, the physical vapor deposition (PVD) system 100/500 includes the processing chamber 110/510, the target holder 120/520, the power supply 130/530, the thickness detector 140/540, the gas system 150/550, and the supporting member 160/560. The target holder 120/520 is disposed in the processing chamber 110/510 for holding the target 200. The power supply 130/530 is in electrical communication with the target 200 for applying a voltage to the target 200. The thickness detector 140/540 is disposed in the processing chamber 110/510 for detecting a thickness TK of the target 200. The gas system 150/550 is configured for supplying carrier gas G into the processing chamber 110/510. The supporting member 160/560 is disposed in the processing chamber 110/510 for holding a substrate 300.

In some embodiments of the present disclosure, the method for physical vapor deposition (PVD) includes providing the target 200 in the vacuum environment, placing the substrate 300 on the supporting member 160/560 facing the target 200 in the vacuum environment, introducing the carrier gas G into the vacuum environment, applying the voltage to the target 200, detecting the thickness TK of the target 200, and replacing the target 200 when the thickness TK of the target 200 is less than a predetermined thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A PVD method, comprising:
  holding a target in a vacuum environment by a target holder including a base wall and a surrounding wall that extends from a periphery of the base wall;
  placing a substrate on a supporting member facing the target in the vacuum environment;
  introducing carrier gas into the vacuum environment;
  applying a voltage to the target;
  rotating a single magnet about a rotation axis passing through a center of the target and the substrate to provide an alternating magnetic field over the target, wherein the magnet is radially aligned with respect to the rotation axis and includes a north pole and a south pole located at two sides of the rotation axis;
  detecting a thickness of the target by a thickness detector, wherein a vertical projection of the thickness detector overlaps a path of a pole of the magnet for every rotation of the magnet; and
  replacing the target when the thickness of the target is less than a predetermined thickness.

2. The PVD method of claim 1, wherein the detecting is performed when applying the voltage to the target.

3. The PVD method of claim 1, wherein the detecting comprises:
  applying a wave to the target;
  receiving the wave reflected by an interface between the target and the vacuum environment; and
  determining the thickness of the target according to a time difference between the applying of the wave and the receiving of the wave and a velocity of the wave in the target.

4. The PVD method of claim 1, wherein the detecting comprises:
  applying an ultrasonic wave to the target;
  receiving the ultrasonic wave reflected by an interface between the target and the vacuum environment; and
  determining the thickness of the target according to a time difference between the applying of the ultrasonic wave and the receiving of the ultrasonic wave and a velocity of the ultrasonic wave in the target.

5. The PVD method of claim 1, wherein the detecting comprises:
  applying an electromagnetic wave to the target;
  receiving the electromagnetic wave reflected by an interface between the target and the vacuum environment; and
  determining the thickness of the target according to a time difference between the applying of the electromagnetic wave and the receiving of the electromagnetic wave and a velocity of the electromagnetic wave in the target.

6. The PVD method of claim 1, wherein the detecting comprises:
  measuring a temperature of the target; and
  determining the thickness of the target according to the temperature of the target.

7. A PVD method, comprising:
  holding a target in a processing chamber by a target holder;
  placing a substrate on a supporting member facing the target;
  introducing carrier gas into the processing chamber;
  applying a voltage to the target;
  rotating a magnet about a rotation axis passing through the target and the substrate to provide an alternating magnetic field over the target, wherein the magnet is radially aligned with respect to the rotation axis and an extension length of the magnet is greater than a width of the target in a direction that is perpendicular to the rotation axis;
  applying a wave to the target by a wave generator, wherein a vertical projection of the wave generator overlaps a path of a pole of the magnet for every rotation of the magnet; and
  receiving the wave reflected from the target.

8. The PVD method of claim 7, further comprising:
  determining a thickness of the target according to at least the received wave; and
  replacing the target when the thickness of the target is less than a predetermined thickness.

9. The PVD method of claim 7, wherein the applying of the wave is performed when applying the voltage to the target.

10. The PVD method of claim 7, wherein the wave reflected from the target is by an interface between the target and a vacuum environment in the processing chamber.

11. The PVD method of claim 7, wherein the wave applied is an ultrasonic wave.

12. The PVD method of claim 7, wherein the wave applied is an electromagnetic wave.

13. A PVD method, comprising:
  providing a target in a processing chamber;

placing a substrate on a supporting member facing the target in the processing chamber;
introducing carrier gas into the processing chamber;
applying a voltage to the target;
rotating a magnet about a rotation axis passing through a center of the target and the substrate to provide an alternating magnetic field over the target, wherein the magnet is radially aligned with respect to the rotation axis and includes a north pole and a south pole located at two sides of the rotation axis; and
measuring a temperature of the target at a pole of the magnet using a thermometer, wherein a vertical projection of the thermometer overlaps a path of the pole of the magnet for every rotation of the magnet.

14. The PVD method of claim 13, further comprising:
determining a thickness of the target according to at least the measured temperature of the target; and
replacing the target when the thickness of the target is less than a predetermined thickness.

15. The PVD method of claim 13, wherein measuring the temperature comprises:
measuring an intensity of an infrared from the target.

16. The PVD method of claim 1, wherein rotating the magnet rotates the pole of the magnet about only a single rotation axis passing through the target and the substrate.

17. The PVD method of claim 1, wherein rotating the magnet rotates the pole of the magnet along the same rotation path for every rotation of the magnet.

18. The PVD method of claim 1, wherein the north pole and the south pole alternatively change position relative to each other during the rotation of the magnet.

19. The PVD method of claim 7, wherein the magnet is radially aligned with respect to the rotation axis and includes a north pole and a south pole located at two sides of the rotation axis, and the north pole and the south pole alternatively change position relative to each other during the rotation of the magnet.

20. The PVD method of claim 13, wherein the north pole and the south pole alternatively change position relative to each other during the rotation of the magnet.

* * * * *